(12) United States Patent
Chen et al.

(10) Patent No.: US 10,892,265 B2
(45) Date of Patent: Jan. 12, 2021

(54) WORD LINE STRUCTURE AND METHOD OF MANUFACTURING THE SAME

(71) Applicant: MACRONIX International Co., Ltd., Hsinchu (TW)

(72) Inventors: Chi-Min Chen, New Taipei (TW); Yung-Tai Hung, Chiayi (TW); Tuung Luoh, Taipei (TW); Ta-Hung Yang, Miaoli County (TW); Kuang-Chao Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/287,910

(22) Filed: Feb. 27, 2019

(65) Prior Publication Data
US 2020/0273868 A1 Aug. 27, 2020

(51) Int. Cl.
| | |
|---|---|
| *H01L 21/768* | (2006.01) |
| *H01L 23/532* | (2006.01) |
| *H01L 27/11521* | (2017.01) |
| *G11C 8/14* | (2006.01) |

(52) U.S. Cl.
CPC ......... *H01L 27/11521* (2013.01); *G11C 8/14* (2013.01); *H01L 21/76886* (2013.01); *H01L 21/76889* (2013.01); *H01L 23/53209* (2013.01)

(58) Field of Classification Search
CPC .............................................. H01L 21/76889
See application file for complete search history.

(56) References Cited

U.S. PATENT DOCUMENTS

| | | | |
|---|---|---|---|
| 7,564,094 B2 | 7/2009 | Kim et al. | |
| 8,530,954 B2 | 9/2013 | Kim et al. | |
| 8,809,933 B2 | 8/2014 | Lee et al. | |
| 9,859,290 B1 | 1/2018 | Wang et al. | |
| 2005/0242390 A1* | 11/2005 | Chen ................ | H01L 21/76889 257/315 |
| 2011/0070732 A1* | 3/2011 | Kwon .................... | C23C 14/18 438/664 |

FOREIGN PATENT DOCUMENTS

| | | |
|---|---|---|
| TW | 200834894 | 8/2008 |
| TW | 201128768 | 8/2011 |
| TW | 201622063 | 6/2016 |
| TW | 201834184 | 9/2018 |
| WO | 2011160001 | 12/2011 |

OTHER PUBLICATIONS

Song, O. "Formation of NiCoSix silicide by thermal annealing of Ni/Co bilayer on Si substrate" Mat. Sci. in Semi. Proc. 8 Jun. 23, 2005 pp. 608-612 (Year: 2005).*
"Office Action of Taiwan Counterpart Application," dated Aug. 14, 2019, p. 1-p. 11.

* cited by examiner

*Primary Examiner* — Grant S Withers
(74) *Attorney, Agent, or Firm* — J.C. Patents

(57) ABSTRACT

Provided is a word line structure including a substrate, a stack structure, and a metal silicide structure. The stack structure is disposed on the substrate. The metal silicide structure is disposed on the stack structure. The metal silicide structure includes a first metal element, a second metal element, and a silicon element. The first metal element is different from the second metal element, and concentrations of the first metal element and the second metal element gradually decrease along a direction from a top surface of the metal silicide structure to the substrate.

19 Claims, 4 Drawing Sheets

WORD LINE STRUCTURE AND METHOD OF MANUFACTURING THE SAME

BACKGROUND

Technical Field

The invention relates to a memory device and a method of manufacturing the same, and more particularly, to a word line structure and a method of manufacturing the same.

Description of Related Art

A metal silicide layer has the advantages of, for instance, high melting point, high stability, and low resistance, and is currently widely applied to integrated circuits. Due to the gradual miniaturization of integrated circuit techniques, the linewidth, the contact area, and the junction depth . . . etc. are gradually becoming smaller. To effectively increase the performance quality of the devices, lower resistance, and reduce signal transmission delay caused by resistance and capacitance, the metal silicide layer is often used to effectively reduce junction resistance.

However, with the advancement of the memory technology, the critical dimension of the memory (e.g., the word line pitch) have also shrunk. Due to the narrowing of the word line pitch, the word line necking is easily generated in the silicidation process and causes the word line bending problem, which may cause leakage current, thereby affecting the performance of the memory.

SUMMARY

The invention provides a word line structure and a method of manufacturing the same, which is able to avoid the word line bending problem caused by the word line necking, thereby improving a stability and an endurance of the impedance of the conventional word line and enhancing the performance of the memory.

The invention provides a word line structure including: a substrate, a stack structure, and a metal silicide structure. The stack structure is disposed on the substrate. The metal silicide structure is disposed on the stack structure. The metal silicide structure includes a first metal element, a second metal element, and a silicon element. The first metal element is different from the second metal element, and concentrations of the first metal element and the second metal element gradually decrease along a direction from a top surface of the metal silicide structure toward the substrate.

In an embodiment of the invention, the first metal element comprises titanium, nickel, or a combination thereof, and the second metal element comprises cobalt.

In an embodiment of the invention, the concentration of the first metal element is less than the concentration of the second metal element, and the concentration of the second metal element is less than a concentration of the silicon element.

In an embodiment of the invention, the metal silicide structure comprises a first portion and a second portion disposed on the first portion, and a ratio of an average concentration of the first metal element in the second portion to an average concentration of the first metal element in the first portion is 5 to 7.

In an embodiment of the invention, a ratio of an average concentration of the second metal element in the second portion to an average concentration of the second metal element in the first portion is 1 to 2.

In an embodiment of the invention, the first metal element has a first concentration gradient, the second metal element has a second concentration gradient, and the first concentration gradient is greater than the second concentration gradient.

In an embodiment of the invention, the stack structure includes a charge storage layer, a conductive layer, and an inter-gate dielectric layer. The conductive layer is disposed on the charge storage layer. The inter-gate dielectric layer is disposed between the charge storage layer and the conductive layer.

In an embodiment of the invention, the word line structure further includes a tunneling dielectric layer disposed between the substrate and the stack structure.

The present invention provides a method of manufacturing a word line structure including following steps. A stack structure is formed on a substrate. A deposition process is performed to sequentially form a first metal layer and a second metal layer, so as to cover a top portion of the stack structure, wherein the first metal layer and the second metal layer have different metals. A heat treatment process is performed to turn the top portion of the stack structure into a metal silicide structure.

In an embodiment of the invention, the first metal layer includes a titanium layer, a nickel layer, or a combination thereof, and the second metal layer includes a cobalt layer.

In an embodiment of the invention, a thickness of the first metal layer is less than a thickness of the second metal layer.

In an embodiment of the invention, the performing the heat treatment process includes following steps. A first heat treatment step is performed, so that the first metal layer and the second metal layer react with the top portion of the stack structure. A selective removal step is performed to remove an unreacted first metal layer and an unreacted second metal layer. A second heat treatment step is performed, and a temperature of the second heat treatment step is greater than a temperature of the first heat treatment step.

In an embodiment of the invention, the deposition process is performed simultaneously with the first heat treatment step.

In an embodiment of the invention, the first heat treatment step is performed after the deposition process.

In an embodiment of the invention, the method further includes forming a cap layer on the second metal layer, wherein the cap layer includes a metal nitride layer.

In an embodiment of the invention, the metal silicide structure includes a first metal element, a second metal element, and a silicon element. The first metal element is different from the second metal element. Concentrations of the first metal element and the second metal element gradually decrease along a direction from a top surface of the metal silicide structure toward the substrate.

In an embodiment of the invention, the concentration of the first metal element is less than the concentration of the second metal element, and the concentration of the second metal element is less than a concentration of the silicon element.

In an embodiment of the invention, the metal silicide structure includes a first portion and a second portion disposed on the first portion, and a ratio of an average concentration of the first metal element in the second portion to an average concentration of the first metal element in the first portion is 5 to 7.

In an embodiment of the invention, a ratio of an average concentration of the second metal element in the second portion to an average concentration of the second metal element in the first portion is 1 to 2.

In an embodiment of the invention, the first metal element has a first concentration gradient, the second metal element has a second concentration gradient, and the first concentration gradient is greater than the second concentration gradient.

Based on the above, in the present invention, the first metal layer and the second metal layer are sequentially formed to cover the top portion of the stack structure, and the heat treatment process is performed to turn the top portion of the stack structure into the metal silicide structure. Since the first metal layer and the second metal layer have different materials, which is able to maintain the shape of the metal silicide structure without being easily necked or bent. In this case, the present embodiment is able to decrease the word line impedance, thereby improving the performance of the memory.

In order to make the aforementioned features and advantages of the disclosure more comprehensible, embodiments accompanying figures are described in detail below.

DESCRIPTION OF EMBODIMENTS

Figure 1A:
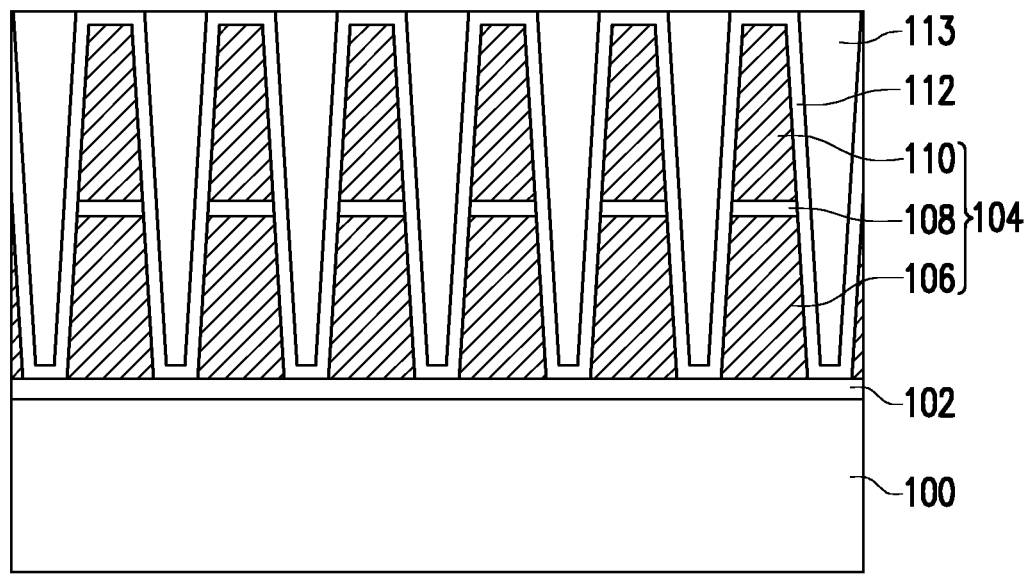
FIG. 1A to FIG. 1E are cross-sectional schematic diagrams illustrating a manufacturing process of a word line structure according to an embodiment of the present invention.

The invention will be described more fully with reference to the drawings of the embodiments. However, the invention can also be embodied in various forms, it should not be limited to the embodiments in this disclosure. The thickness of the layers and the regions in the drawings will be magnified for clarity. The same or similar reference numerals indicate the same or similar elements; it will not be repeated one by one in following paragraphs.

FIG. 1A to FIG. 1E are cross-sectional schematic diagrams illustrating a manufacturing process of a word line structure according to an embodiment of the present invention. The word line structure described in the following embodiments may apply in a memory device, such as a flash memory. However, the invention is not limited thereto.

Referring to FIG. 1A, a method of manufacturing a word line structure 10 (shown in FIG. 1D) of the embodiment of the present invention is as follows. First, a substrate 100 is provided. In some embodiments, the substrate 100 is, for instance, a semiconductor substrate, a semiconductor compound substrate, or a semiconductor on insulator (SOI). The semiconductor is, for instance, a Group IVA atom such as silicon or germanium. The semiconductor compound is, for instance, a semiconductor compound formed by a Group IVA atom, such as silicon carbide or silicon germanium, or a semiconductor compound formed by a Group IIIA atom and a Group VA atom, such as gallium arsenide.

A tunneling dielectric layer 102 is then formed on the substrate 100. As shown in FIG. 1A, the tunneling dielectric layer 102 blanketly covers a surface of the substrate 100. In some embodiments, the tunneling dielectric layer 102 may be made of a single material layer. The single material layer is a low dielectric constant material or a high dielectric constant material, for example. The low dielectric constant material is a dielectric material having a dielectric constant smaller than 4, such as silicon oxide or silicon oxynitride. The high dielectric constant material is a dielectric material having a dielectric constant greater than 4, such as HfAlO, $HfO_2$, $Al_2O_3$, or $Si_3N_4$, for example. In alternative embodiments, the tunneling dielectric layer 102 may be a double-layer structure or a multi-layer structure.

Thereafter, a plurality of stack structures 104 are formed on the tunneling dielectric layer 102, so that the tunneling dielectric layer 102 is located between the substrate 100 and the stack structures 104. Specifically, the stack structure 104 sequentially includes a charge storage layer 106, an inter-gate dielectric layer 108, and a conductive layer 110 from bottom to top. In some embodiments, a material of the charge storage layer 106 includes a conductive material, which may be doped polysilicon, undoped polysilicon, or a combination thereof, for example. In the embodiment, the charge storage layer 106 may be a floating gate. A material of the inter-gate dielectric layer 108 includes a dielectric material, which may be silicon oxide, silicon nitride, silicon oxynitride, or a combination thereof, for example. The inter-gate dielectric layer 108 may be a single layer structure or a multilayer structure. In the embodiment, the inter-gate dielectric layer 108 may be a composite layer made of oxide/nitride/oxide (ONO), for example. A material of conductive layer 110 includes a conductive material, which may be doped polysilicon, undoped polysilicon, or a combination thereof, for example. In the embodiment, the conductive layer 110 may be a control gate.

In some embodiments, the stack structures 104 are spaced apart from each other in an equidistant manner, as shown in FIG. 1A. However, the present invention is not limited thereto. In other embodiments, the stack structures 104 may also be spaced apart from each other in a non-equidistant manner. In alternative embodiments, widths or bottom areas of the stack structures 104 may be the same or different from each other.

After forming the stack structures 104, a liner layer 102 is formed to conformally cover the stack structures 104. In some embodiments, a material of the liner layer 102 includes a dielectric material, which may be silicon oxide, silicon nitride, silicon oxynitride, or a combination thereof, for example. A dielectric layer 113 is then formed to fill in trenches or spaces between the stack structures 104. In some embodiments, a material of the dielectric layer 113 includes a dielectric material, which may be silicon oxide, silicon nitride, silicon oxynitride, or a combination thereof, for example. In some alternative embodiments, the liner layer 102 and the dielectric layer 113 have different materials. For example, the liner layer 102 may be a silicon oxide layer, and the dielectric layer 113 may be a silicon nitride layer. On the other hand, after forming the dielectric layer 113, a planarization process may be optionally performed, so that top surfaces of the dielectric layer 113 and the liner layer 112 are coplanar, as shown in FIG. 1A.

Figure 1B:
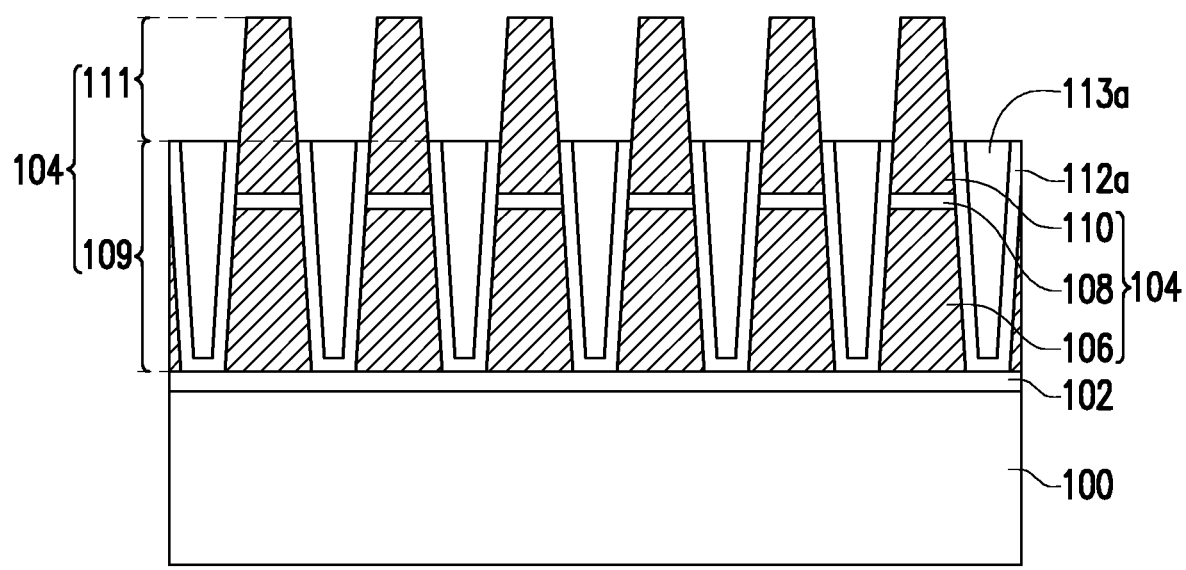

Referring to FIG. 1A and FIG. 1B, a portion of the dielectric layer 113 and a portion of the liner layer 112 are sequentially removed, so that top portions 111 of the stack structures 104 are exposed by the dielectric layer 113a and the liner layer 112a. A ratio of the top portion 111 to a bottom portion 109 of the stack structure 104 may be adjusted according to requirements, and the invention is not limited thereto. In some embodiments, the top surface of the liner layer 112a is at least higher than a top surface of the inter-gate dielectric layer 108.

Figure 1C:
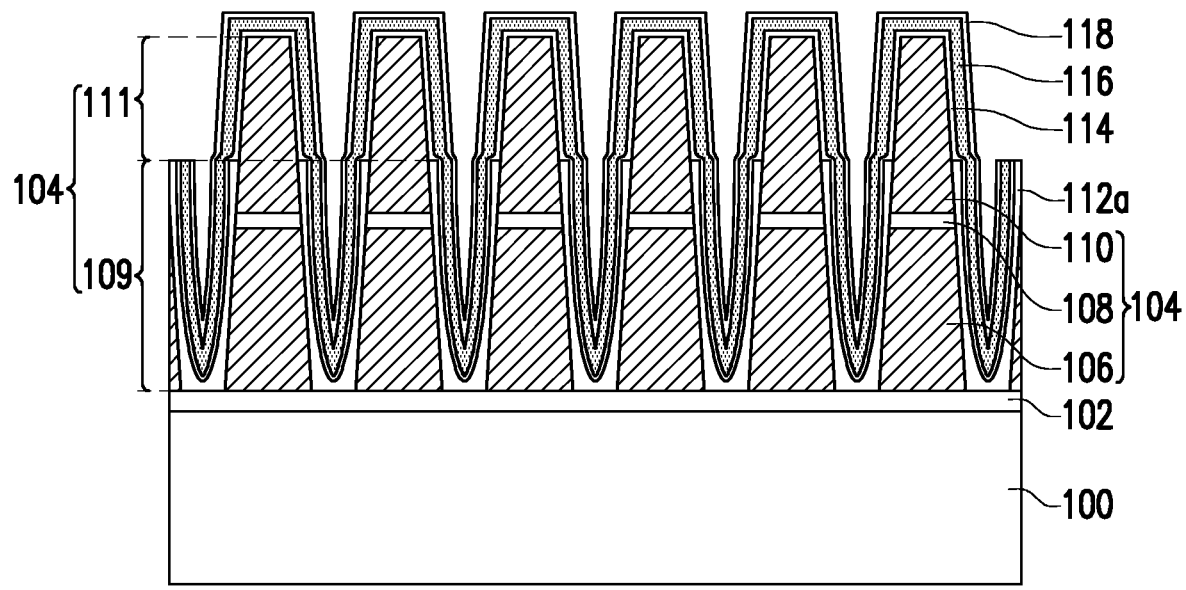

Referring to FIG. 1B and FIG. 1C, after exposing the top portions 111 of the stack structures 104, the dielectric layer 113a is completely removed. A deposition process then is performed to form a first metal layer 114, a second metal layer 116, and a cap layer 118 in order. In the case, the first metal layer 114, the second metal layer 116, and the cap layer 118 at least conformally cover top surfaces and sidewalls of the top portions 111 of the stack structures 104. In alternative embodiments, as shown in FIG. 1C, the first metal layer 114, the second metal layer 116, and the cap layer 118 extend to cover the surface of the liner layer 112a. In some embodiments, the first metal layer 114 includes a titanium layer, a nickel layer, or a combination thereof, which may have a thickness of 0.5 nm to 3 nm. The second metal layer 116 includes a cobalt layer, which may have a thickness of 5 nm to 8 nm. In the present embodiment, the first metal layer 114 and the second metal layer 116 have different metals, and the thickness of the first metal layer 114 is smaller than the thickness of the second metal layer 116. The cap layer 118 includes a metal nitride layer, such as titanium nitride (TiN), which may have a thickness of 5 nm to 10 nm.

Figure 1D:
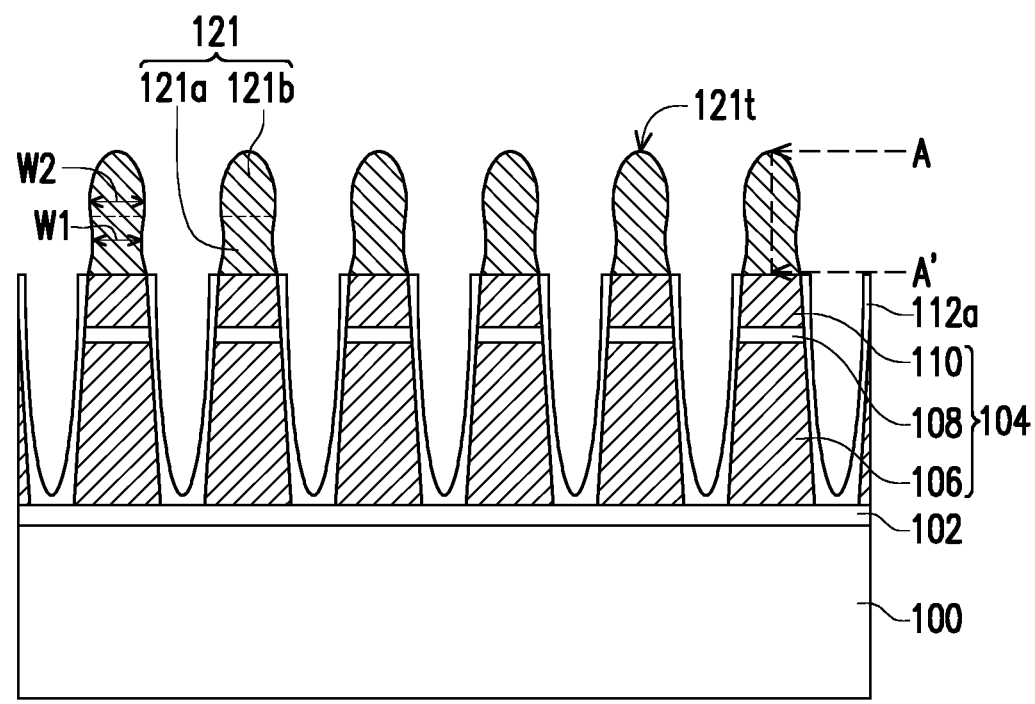

Referring to FIG. 1C and FIG. 1D, a heat treatment process (or a silicidation process) is performed to convert or turn the top portion 111 of the stack structure 104 into a metal silicide structure 121. Hereinafter, the bottom 109 of the stack structure 104 is referred to as the stack structure 104, and the metal silicide structure 121 is located on the stack structure 104. Specifically, the heat treatment process includes the following steps. A first heat treatment step is performed, so that the first metal layer 114 and the second metal layer 116 react with the top portion 111 of the stack structure 104 to form a first metal silicide. In the case, the above first metal silicide may be a metastable phase structure, for example. In some embodiments, the first heat treatment step may be a rapid thermal process (RTP), which may have a temperature of 450° C. to 500° C., and may have a processing time of 30 seconds to 180 seconds.

After the first metal silicide is formed, a selective removal step is performed to remove the unreacted first metal layer 114, the unreacted second metal layer 116, and the cap layer 118. In some embodiments, the selective removal step is, for example, performing an RCA cleaning process. The RCA cleaning process includes using a mixture of water ($H_2O$)/hydrogen peroxide ($H_2O_2$)/ammonia ($NH_4OH$) (i.e., a standard cleaning solution SC1), using a mixture of water ($H_2O$)/hydrogen peroxide ($H_2O_2$)/hydrochloric acid (HCl) (i.e., a standard cleaning solution SC2) or a combination of SC1 and SC2.

After removing the unreacted first metal layer 114, the unreacted second metal layer 116, and the cap layer 118, a second heat treatment step is performed to convert or turn the first metal silicide into a second metal silicide having a lower resistance value, namely, the metal silicide structure 121 illustrated in FIG. 1D. In the case, the second metal silicide may be a stable phase structure, for example. That is, the phase structure of the second metal silicide is more stable than the phase structure of the first metal silicide. In some embodiments, the second heat treatment step may be another rapid thermal process, which may have a temperature of 700° C. to 900° C., and may have a processing time of 10 seconds to 90 seconds. In alternative embodiments, the temperature of the second heat treatment step is greater than the temperature of the first heat treatment step.

In addition, although the first heat treatment step is performed after the deposition process, the present invention is not limited thereto. In other embodiments, the deposition process and the first heat treatment step may also be performed simultaneously. That is to say, the deposition and heating may be performed simultaneously in the same chamber. In other words, the deposition process and the first heat treatment step may be performed in an in-situ manner.

As shown in FIG. 1D, during the silicidation process, the top portion 111 may react with the first metal layer 114 and the second metal layer 116, so that a portion of the top portion 111 may be consumed. Therefore, the volume of the reacted metal silicide structure 121 may be less than the volume of the unreacted top portion 111. The shrinkage phenomenon of the foregoing metal silicide causes the sidewall of the metal silicide structure 121 to be more retracted or pullback than the sidewall of the stack structure 104.

It should be noted that, in the embodiment, the first metal layer 114 and the second metal layer 116 composed of different metal materials are used to react with the top portion 111 in the silicidation process, which may solve the problem of necking or deformation of the metal silicide structure 121 to reduce the word line impedance, thereby enhancing the performance of the memory. Hereinafter, take the first metal layer 114 being a titanium layer, and the second metal layer 116 being a cobalt layer as an example. In some embodiments, the movement rate of the titanium element in the titanium layer 114 is less than the movement rate of the cobalt element in the cobalt layer 116. In the case, most of the cobalt element diffuses into the top portion 111, while most of the titanium element stays at the surface of the top portion 111. Therefore, the titanium element may maintain the shape of the metal silicide structure 121 without being necked and causing the bending phenomenon. Compared with performing the silicidation process with a single cobalt layer, the present embodiment inserts the titanium layer between the cobalt layer and the silicon layer to perform the silicidation process, so that the metal silicide structure 121 formed has the features of a straighter contour with less bending, and also improve the stability and the endurance of the impedance of the word line. In another embodiment, the cobalt atom consumes more the silicon atoms than the titanium or nickel atoms in the silicidation process. Therefore, compared with the silicidation process with the single cobalt layer, the present embodiment inserts the titanium layer between the cobalt layer and the silicon layer to perform the silicidation process, and the formed metal silicide structure 121 is not easily to be shrunk. Therefore, the shape of the metal silicide structure 121 is maintained and is not easily deformed.

Figure 2:
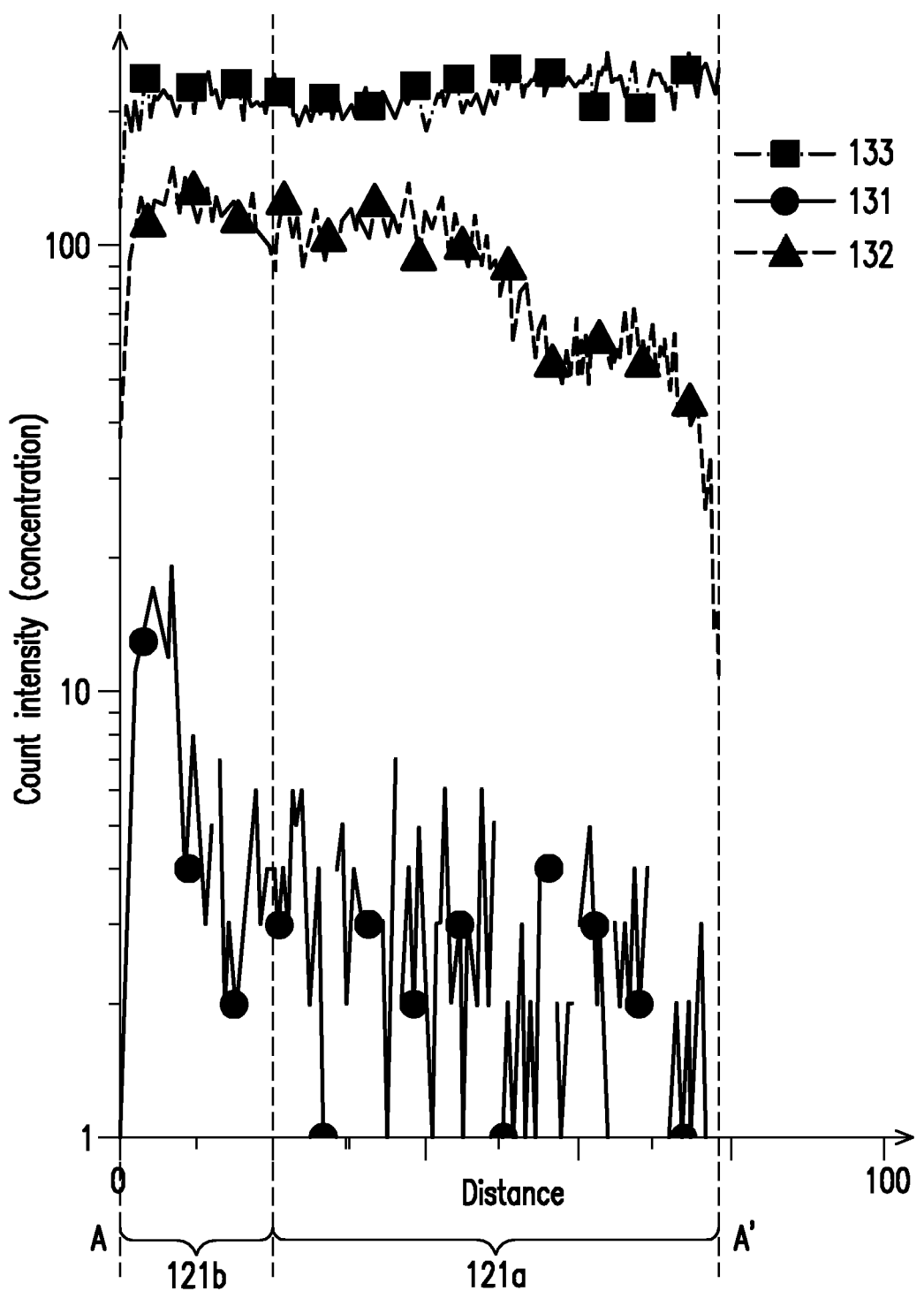
FIG. 2 shows the relationship between count intensity (concentration) and distance along line A-A' depicted in FIG. 1D.

Referring to FIG. 1D and FIG. 2, the metal silicide structure 121 is disposed on the stack structure 104. The metal silicide structure 121 includes a first metal element 131, a second metal element 132, and a silicon element 133. In an embodiment, the first metal element 131 includes titanium, nickel, or a combination thereof, and the second metal element 132 includes cobalt. In another embodiment, the first metal element 131 is different from the second metal element 132. As shown in FIG. 2, a concentration of the first metal element 131 and a concentration of the second metal element 132 gradually decrease along a direction from a top surface 121t of the metal silicide structure 121 toward the substrate 100 (i.e., the line A-A'). The concentration of the first metal element 131 is less than the concentration of the second metal element 132, and the concentration of the second metal element 132 is less than a concentration of the silicon element 133.

In other embodiments, the first metal element 131 has a first concentration gradient and the second metal element 132 has a second concentration gradient. Herein, the "concentration gradient" refers to a concentration difference, a slope of a concentration curve, or a ratio of the maximum concentration to the minimum concentration. As shown in FIG. 2, the first concentration gradient of the first metal element 131 is greater than the second concentration gradient of the second metal element 132. That is, most of the first metal element 131 (e.g., Ti) is located or concentrated at the top surface 121t of the metal silicide structure 121, while most of the second metal element 132 (e.g., Co) is diffused or uniformly dispersed into the metal silicide structure 121.

Specifically, the metal silicide structure 121 includes a first portion 121a and a second portion 121b located on the first portion 121a, as shown in FIG. 1D. In some embodiments, a middle width W1 of the first portion 121a may be smaller than or equal to a middle width W2 of the second portion 121b, but the invention is not limited thereto. As shown in FIG. 2, a ratio (R1) of an average concentration of the first metal element 131 in the second portion 121b to an average concentration of the first metal element 131 in the first portion 121a is 5 to 7 along the direction from the top surface 121t of the metal silicide structure 121 toward the substrate 100 (i.e., the line A-A'), in an embodiment. That is, the average concentration of the first metal element 131 in the first portion 121a is about 5 to 7 times than the average concentration of the first metal element 131 in the second portion 121b. In another embodiment, a ratio (R2) of an average concentration of the second metal element 132 in the second portion 121b to an average concentration of the second metal element 132 in the first portion 121a is 1 to 2. In alternative embodiments, the said ratio (R1) is greater than the said ratio (R2). In other words, the first metal element 131 is concentrated in the second portion 121b, while the second metal element 132 is uniformly distributed in the first portion 121a and the second portion 121b.

Figure 1E:
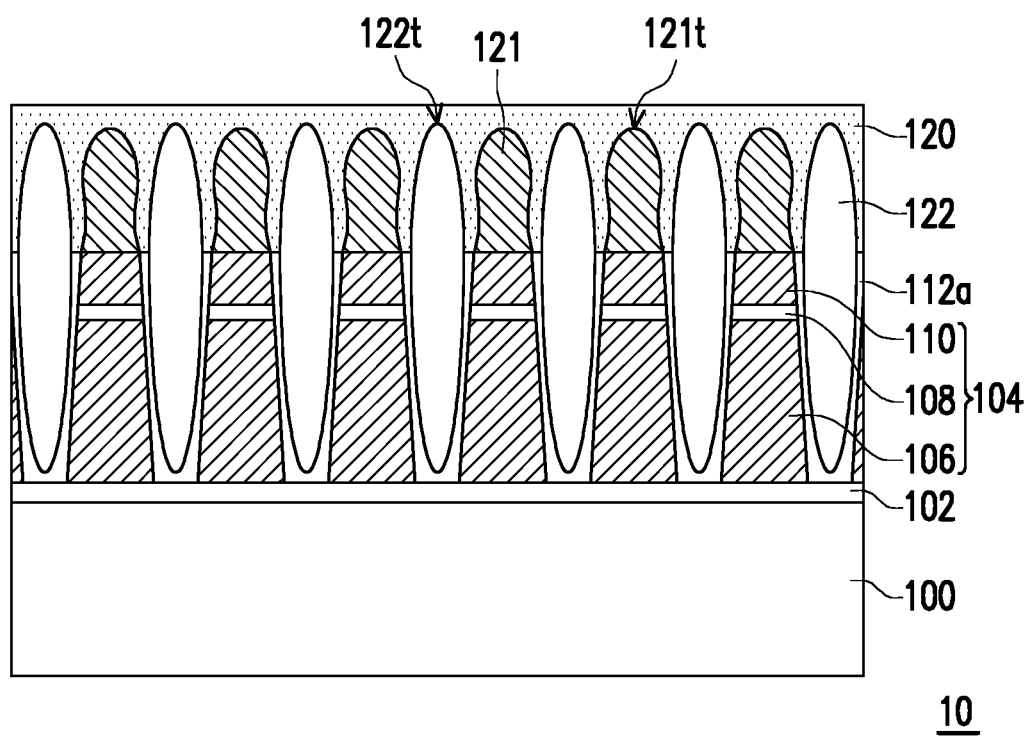

Referring to FIG. 1D and FIG. 1E, after the metal silicide structure 121 is formed, the word line structure 10 is accomplished. After forming the word line structure 10, a dielectric layer 120 may be formed to cover the metal silicide structure 121. In some embodiments, a material of the dielectric layer 120 includes silicon oxide, phosphosilicate glass (PSG), borophosphosilicate glass (BPSG), or a combination thereof. Since the pitch between two adjacent metal silicide structures 121 is small, an air gap 122 is formed therein when the dielectric layer 120 is filled in the spaces between the metal silicide structures 121. As shown in FIG. 1E, the air gaps 122 are respective located between the stack structures 104, and extend from lower portions of the stack structures 104 to upper portions of the metal silicide structures 121. In some embodiments, since the dielectric constant of the air gaps 122 approaches 1, the air gaps 122 may reduce the capacitance between the metal silicide structures 121 and reduce RC delay. As shown in FIG. 1E, a top surface 122t of the air gap 122 may be equal to or higher than the top surface 121t of the metal silicide structure 121. In another embodiment, the air gap 122 may or may not contact the top surface of the tunneling dielectric layer 102. In alternative embodiments, the air gap 122 includes a single air gap or more than two air gaps.

In summary, in the present invention, the first metal layer and the second metal layer are sequentially formed to cover the top portion of the stack structure, and the heat treatment process is performed to turn the top portion of the stack structure into the metal silicide structure. Since the first metal layer and the second metal layer have different materials, which is able to maintain the shape of the metal silicide structure without being easily necked or bent. In this case, the present embodiment is able to decrease the word line impedance, thereby improving the performance of the memory.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A word line structure, comprising:
a stack structure disposed on a substrate; and
a metal silicide structure disposed on the stack structure, wherein the metal silicide structure comprises a first metal element, a second metal element, and a silicon element, the first metal element is different from the second metal element, concentrations of the first metal element and the second metal element gradually decrease along a direction from a top surface of the metal silicide structure to the substrate, and a concentration of the silicon element does not gradually increase or decrease along the direction from the top surface of the metal silicide structure to the substrate.

2. The word line structure according to claim 1, wherein the first metal element comprises titanium, nickel, or a combination thereof, and the second metal element comprises cobalt.

3. The word line structure according to claim 2, wherein the concentration of the first metal element is less than the concentration of the second metal element, and the concentration of the second metal element is less than the concentration of the silicon element.

4. The word line structure according to claim 2, wherein the metal silicide structure comprises a first portion and a second portion disposed on the first portion, and a ratio of an average concentration of the first metal element in the second portion to an average concentration of the first metal element in the first portion is 5:1 to 7:1.

5. The word line structure according to claim 4, wherein a ratio of an average concentration of the second metal element in the second portion to an average concentration of the second metal element in the first portion is 1:1 to 2:1.

6. The word line structure according to claim 2, wherein the first metal element has a first concentration gradient, the second metal element has a second concentration gradient, and the first concentration gradient is greater than the second concentration gradient.

7. The word line structure according to claim 1, wherein the stack structure comprises:
a charge storage layer;
a conductive layer, disposed on the charge storage layer; and
an inter-gate dielectric layer, disposed between the charge storage layer and the conductive layer.

8. The word line structure according to claim 1, further comprising a tunneling dielectric layer disposed between the substrate and the stack structure.

9. A method of manufacturing a word line structure, comprising:
forming a stack structure on a substrate;
performing a deposition process to sequentially form a first metal layer comprising a first metal element and a second metal layer comprising a second metal element, so as to cover a top portion of the stack structure, wherein the first metal element is different from the second metal element; and performing a heat treatment process to turn the top portion of the stack structure into a metal silicide structure, wherein the metal silicide structure comprises the first metal element, the second metal element, and a silicon element, concentrations of the first metal element and the second metal element gradually decrease along a direction from a top surface of the metal silicide structure to the substrate, and a concentration of the silicon element does not gradually increase or decrease along the direction from the top surface of the metal silicide structure to the substrate.

10. The method according to claim 9, wherein the first metal layer comprises a titanium layer, a nickel layer, or a combination thereof, and the second metal layer comprises a cobalt layer.

11. The method according to claim 9, a thickness of the first metal layer is less than a thickness of the second metal layer.

12. The method according to claim 9, wherein the performing the heat treatment process comprises:
   performing a first heat treatment step, so that the first metal layer and the second metal layer react with the top portion of the stack structure;
   performing a selective removal step to remove an unreacted first metal layer and an unreacted second metal layer; and
   performing a second heat treatment step, wherein a temperature of the second heat treatment step is greater than a temperature of the first heat treatment step.

13. The method according to claim 12, wherein the deposition process is performed simultaneously with the first heat treatment step.

14. The method according to claim 12, wherein the first heat treatment step is performed after the deposition process.

15. The method according to claim 9, further comprising forming a cap layer on the second metal layer, wherein the cap layer comprises a metal nitride layer.

16. The method according to claim 9, wherein the concentration of the first metal element is less than the concentration of the second metal element, and the concentration of the second metal element is less than the concentration of the silicon element.

17. The method according to claim 9, wherein the metal silicide structure comprises a first portion and a second portion disposed on the first portion, and a ratio of an average concentration of the first metal element in the second portion to an average concentration of the first metal element in the first portion is 5:1 to 7:1.

18. The method according to claim 17, wherein a ratio of an average concentration of the second metal element in the second portion to an average concentration of the second metal element in the first portion is 1:1 to 2:1.

19. The method according to claim 9, wherein the first metal element has a first concentration gradient, the second metal element has a second concentration gradient, and the first concentration gradient is greater than the second concentration gradient.

* * * * *